(12) United States Patent
Shimizu

(10) Patent No.: US 11,737,251 B2
(45) Date of Patent: Aug. 22, 2023

(54) BASE TAPE AND ELECTRONIC COMPONENT ARRAY

(71) Applicant: Murata Manufacturing Co., Ltd., Nagaokakyo (JP)

(72) Inventor: Yasuhiro Shimizu, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 202 days.

(21) Appl. No.: 17/078,138

(22) Filed: Oct. 23, 2020

(65) Prior Publication Data

US 2021/0144889 A1 May 13, 2021

(30) Foreign Application Priority Data

Nov. 12, 2019 (JP) ................................ 2019-204692

(51) Int. Cl.
*H05K 13/02* (2006.01)
*H05K 9/00* (2006.01)
*H01G 4/30* (2006.01)
*H01G 2/06* (2006.01)
*H05K 13/04* (2006.01)

(52) U.S. Cl.
CPC ........... *H05K 9/0079* (2013.01); *H05K 13/02* (2013.01); *H01G 2/065* (2013.01); *H01G 4/30* (2013.01); *H05K 13/0419* (2018.08)

(58) Field of Classification Search
CPC .. H05K 9/0079; H05K 13/02; H05K 13/0419; H05K 13/0434; H05K 13/046; H01G 2/065; B65D 85/00; B65G 54/02

(Continued)

(56) References Cited

U.S. PATENT DOCUMENTS 4,478,903 A 10/1984 Kishida et al.
5,846,621 A * 12/1998 Nagamatsu .......... H05K 13/003
428/40.1

(Continued)

FOREIGN PATENT DOCUMENTS

CN 107662762 A 2/2018
JP 57-205145 A 12/1982

(Continued)

OTHER PUBLICATIONS

Official Communication issued in corresponding Korean Patent Application No. 10-2020-0140974, dated Dec. 21, 2021.

(Continued)

*Primary Examiner* — Danny Nguyen
(74) *Attorney, Agent, or Firm* — Keating & Bennett, LLP

(57) ABSTRACT

A base tape includes an accommodating section having a rectangular or substantially rectangular parallelepiped, and the base tape includes a surface layer including a carbon layer. The accommodating section includes a bottom surface portion, a side wall portion including a plurality of surfaces, and an opening portion. The side wall portion includes at at least one surface thereof an edge portion located between the bottom surface portion and the opening portion and an electrical discharge path portion inclined from the edge portion toward the opening portion. An electronic component array includes the base tape, an electronic component accommodated in the accommodating section of the base tape, and a cover tape that covers the accommodating section.

20 Claims, 6 Drawing Sheets

(58) Field of Classification Search
USPC .................................................. 361/212, 220
See application file for complete search history.

(56) References Cited

U.S. PATENT DOCUMENTS

| | | | |
|---|---|---|---|
| 2002/0031660 A1* | 3/2002 | Hashizume | B32B 3/02 |
| | | | 428/343 |
| 2015/0158649 A1* | 6/2015 | Huang | H05K 13/0084 |
| | | | 428/354 |
| 2018/0029783 A1 | 2/2018 | Arai et al. | |

FOREIGN PATENT DOCUMENTS

| | | |
|---|---|---|
| JP | 03-87097 A | 4/1991 |
| JP | 3012490 U | 4/1995 |
| JP | 10-329885 A | 12/1998 |
| JP | 2000-021247 A | 1/2000 |
| JP | 2002284283 A | 10/2002 |
| JP | 2009-184681 A | 8/2009 |
| JP | 2011-195161 A | 10/2011 |
| JP | 2012-218793 A | 11/2012 |
| JP | 2016-146469 A | 8/2016 |
| JP | 2018-135154 A | 8/2018 |

OTHER PUBLICATIONS

Official Communication issued in corresponding Chinese Patent Application No. 202011226942.3, dated May 10, 2022.
Official Communication issued in corresponding Japanese Patent Application No. 2019-204692, dated Apr. 5, 2022.
Final Office Action in JP2019-204692, dated Sep. 13, 2022, 5 pages.

* cited by examiner

CROSS SECTION VA-VA $31a \begin{cases} 32a \\ 34a \\ 36a \end{cases}$   $31c \begin{cases} 32c \\ 34c \\ 36c \end{cases}$ ENLARGED VIEW OF PORTION b

CROSS SECTION VI-VI $31b \begin{cases} 32b \\ 34b \\ 36b \end{cases}$ $31d \begin{cases} 32d \\ 34d \\ 36d \end{cases}$

BASE TAPE AND ELECTRONIC COMPONENT ARRAY

CROSS REFERENCE TO RELATED APPLICATIONS

This application claims the benefit of priority to Japanese Patent Application No. 2019-204692 filed on Nov. 12, 2019. The entire contents of this application are hereby incorporated herein by reference.

BACKGROUND OF THE INVENTION

1. Field of the Invention

The present invention relates to a base tape and an electronic component array.

2. Description of the Related Art

An electronic component array having a function of protecting electronic components when the electronic components are stored, transported, and mounted, and aligning and extracting the electronic components to be mounted on a printed circuit board, has conventionally been used. The electronic component array includes an electronic component, a base tape that accommodates the electronic component in an accommodating section, and a cover tape provided to cover the electronic component.

An electronic component may be destroyed by static electricity or may be unsatisfactorily mounted due to static electricity. In order to protect the electronic component from static electricity, Japanese Patent Laid-Open No. 2000-021247 discloses that a base tape made of a resin composition has one surface provided with a coating layer of a conductive paint including carbon black and an inorganic filler to prevent an electronic component accommodated in an electronic component array from being electrically charged.

However, the base tape as disclosed in Japanese Patent Laid-Open No. 2000-021247 receives pressure in a direction perpendicular to the coating layer when an accommodating section is molded in the base tape, and depending on the shape of the accommodating section, the coating layer had the carbon black torn, such that the density thereof was inconsistent in some cases. When the carbon black is inconsistent in density, the coating layer cannot sufficiently provide its antistatic ability. This will be described in more detail with reference to FIGS. 9A and 9B. FIG. 9A is a cross section at a location of ½ of the length of a shorter side of an accommodating section of a conventional base tape, and FIG. 9B is a cross section at a location of ½ of the length of a longer side of the accommodating section of the conventional base tape. In FIGS. 9A and 9B, a black portion is a coating layer with carbon black included therein, and a white portion is the coating layer with carbon black torn. When the longer side of the accommodating section (FIG. 9A) and the shorter side of the accommodating section (FIG. 9B) are compared, the longer side experiences stress when the accommodating section is molded, and the coating layer has the carbon black torn such that the density thereof is inconsistent.

SUMMARY OF THE INVENTION

Preferred embodiments of the present invention provide base tapes that each have an antistatic ability to protect an electronic component, and electronic component arrays including electronic components accommodated on the base tapes.

A base tape according to a preferred embodiment of the present invention includes an accommodating section having a rectangular or substantially rectangular parallelepiped shape, the base tape including a surface layer including a carbon layer, the accommodating section including a bottom surface portion, a side wall portion including a plurality of surfaces, and an opening portion, the side wall portion including at at least one surface thereof an edge portion located between the bottom surface portion and the opening portion and an electrical discharge path portion inclined from the edge portion toward the opening portion.

A base tape according to a preferred embodiment of the present invention includes a carbon layer provided to a surface layer which comes into contact with an electronic component, and the base tape is thus satisfactorily conductive, and even when the electronic component is electrically charged, it is able to be electrically discharged through the carbon layer. Furthermore, providing the accommodating section with an electrical discharge path portion allows the carbon layer to be extended in the vertical direction in a reduced range to prevent an antistatic ability from being reduced as the carbon layer would otherwise be torn.

Preferred embodiments of the present invention are thus able to provide base tapes that each have an antistatic ability to protect an electronic component, and electronic component arrays including electronic components accommodated on the base tapes.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
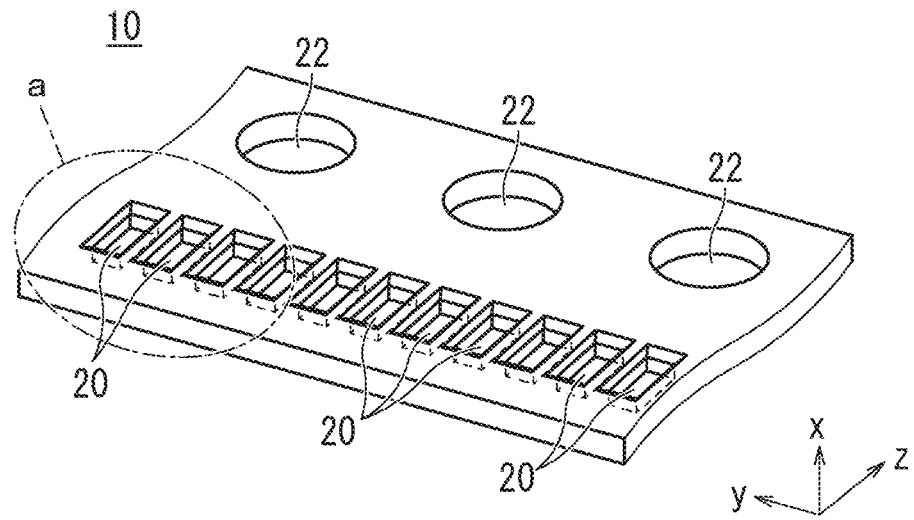
FIG. 1 is a perspective view of a base tape according to a preferred embodiment of the present invention.

Hereinafter, a base tape 10 and an electronic component array 12 according to preferred embodiments of the present invention will be described with reference to the drawings. In the following description of the preferred embodiments, identical or equivalent components in the drawings will be denoted by the same reference character, and thus described.

Base tape 10 has a height in a direction x, a length in a direction y and a width (or a shorter side) in a direction z. Accordingly, electronic component array 12 has a height, a length and a width (or a shorter side) in the same directions as directions x, y and z in which base tape 10 has its height, length and width (or shorter side), respectively.

1. Base Tape

Base tape 10 according to a preferred embodiment of the present invention will now be described with reference to FIG. 1. FIG. 1 is a perspective view of a base tape according to a preferred embodiment of the present invention.

Base tape 10 according to the present preferred embodiment of the present invention is elongate and includes an accommodating section 20 having a rectangular or substantially rectangular parallelepiped shape to accommodate an electronic component 14. Base tape 10 according to the present preferred embodiment of the present invention includes feeding holes 22.

Electronic component 14 is preferably, for example, a resistor, a capacitor, an inductor, a switch, a connector, a coil, and the like. In the present preferred embodiment, a multilayer ceramic capacitor 14 will be described as an example of electronic component 14. Although multilayer ceramic capacitor 14 will be described as an example of electronic component 14 in the present preferred embodiment, the electronic component is not limited to a multilayer ceramic capacitor.

Figure 3:
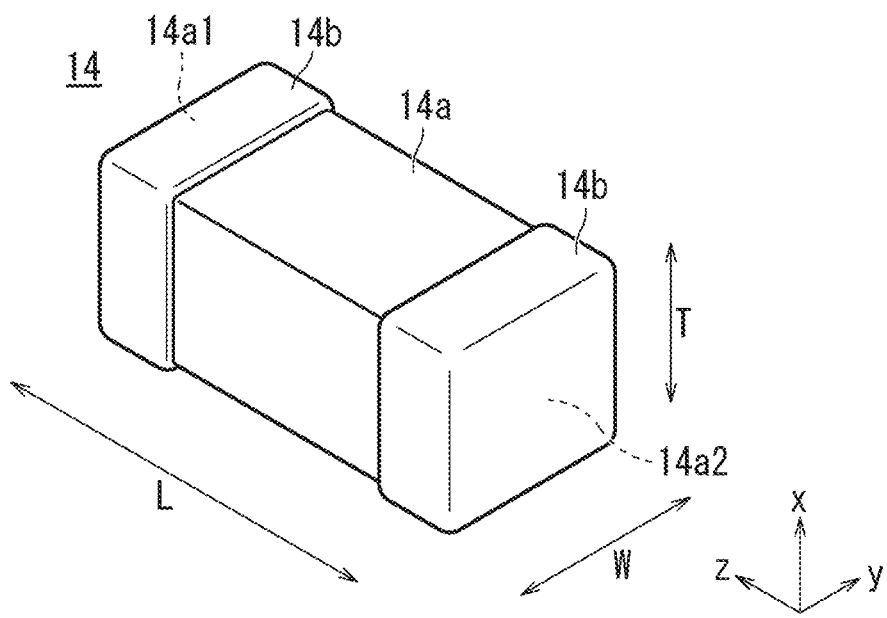
FIG. 3 is a perspective view of a multilayer ceramic capacitor according to a preferred embodiment of the present invention.

Multilayer ceramic capacitor 14 will be described with reference to FIG. 3. FIG. 3 is a perspective view of a multilayer ceramic capacitor according to a preferred embodiment of the present invention.

Multilayer ceramic capacitor 14 includes a multilayer body 14a having a rectangular or substantially parallelepiped external shape, and a pair of external electrodes 14b provided at opposite ends of multilayer body 14a.

Multilayer ceramic capacitor 14 including the pair of external electrodes 14b preferably has an external shape having, for example, a dimension of about 0.25 mm or more and about 0.6 mm or less in a longitudinal direction L of multilayer ceramic capacitor 14, a dimension of about 0.125 mm or more and about 0.30 mm or less in a widthwise direction W of multilayer ceramic capacitor 14, and a dimension of about 0.125 mm or more and about 0.30 mm or less in a layer stacking direction T of multilayer ceramic capacitor 14.

Accommodating sections 20 are aligned in a line in longitudinal direction y of base tape 10 at predetermined intervals. Accommodating section 20 accommodates multilayer ceramic capacitor 14. Accommodating section 20 is disposed on base tape 10 on one side in widthwise direction z. A space generally having a rectangular or substantially rectangular parallelepiped shape is provided inside accommodating section 20. Accommodating section includes an opening portion which is rectangular or substantially rectangular in a plan view.

Feeding holes 22 are aligned in base tape 10 in longitudinal direction y at predetermined intervals. Feeding holes 22 are provided for automatic conveyance in an automatic component feeder. Feeding holes 22 are engaged with teeth of the automatic component feeder to enable the automatic component feeder to automatically convey base tape 10.

Base tape 10 is made of, for example, resin or paper. Base tape 10 is preferably made of one of polystyrene, polyethylene terephthalate, polycarbonate, and polypropylene, for example. A base tape 10 made of such a material facilitates molding the accommodating section and also allows an operation to be performed in a clean room.

Furthermore, base tape 10 includes a layer (a surface layer) 16a which comes into contact with multilayer ceramic capacitor 14 and includes a carbon layer. Thus, even if multilayer ceramic capacitor 14 is electrically charged, it is in contact with the carbon layer, which has good conductivity, and can thus discharge static electricity. Further, base tape 10 preferably has a layered structure including a plurality of layers, and when first layer 16a is a layer that comes into contact with multilayer ceramic capacitor 14, first layer 16a is preferably provided with a carbon layer. Providing a carbon layer to first layer 16a coming into contact with multilayer ceramic capacitor 14 can improve conductivity and enables an antistatic ability to be provided.

Figure 4:
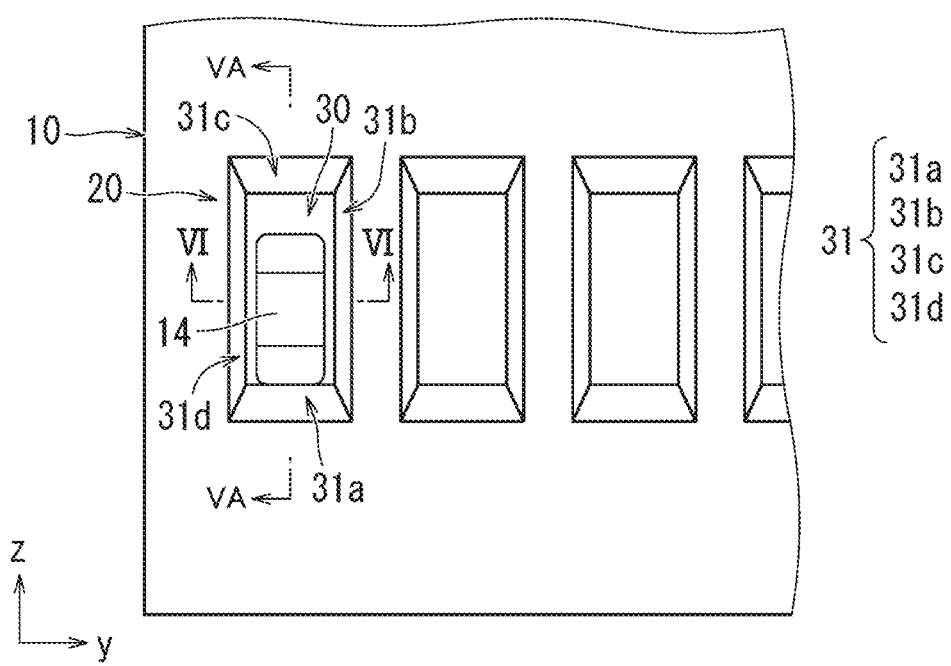
FIG. 4 shows a portion a shown in FIG. 1 with a multilayer ceramic capacitor accommodated therein.
Figure 5A:
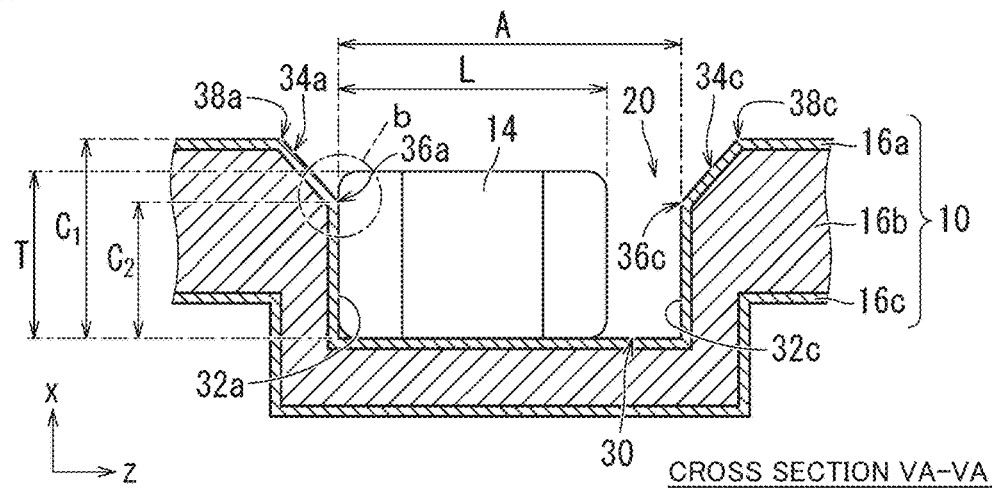
FIG. 5A is a cross section taken along a line VA-VA indicated in FIG. 4.
Figure 5B:
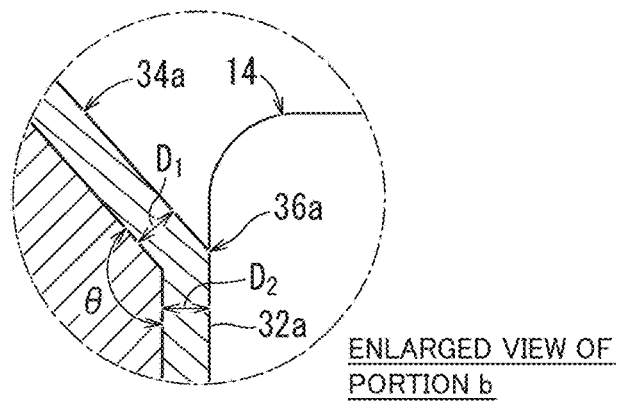
FIG. 5B is an enlarged view of a portion b shown in FIG. 5A.
Figure 6:
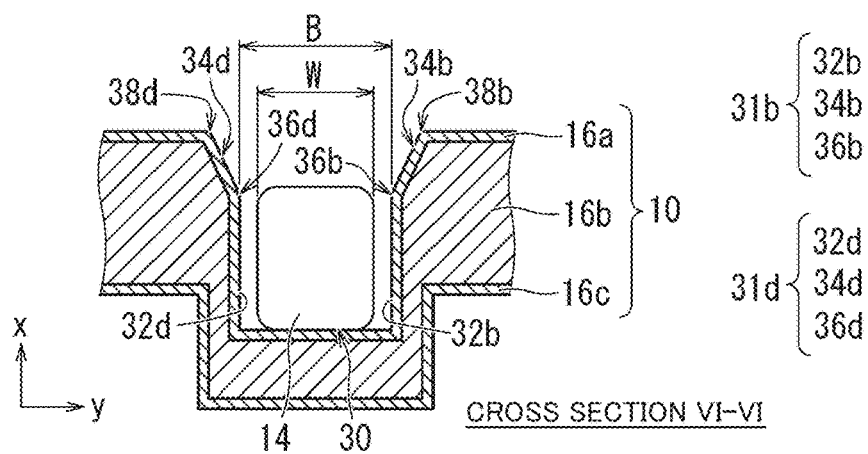
FIG. 6 is a cross section taken along a line VI-VI indicated in FIG. 4.
Figure 7A:
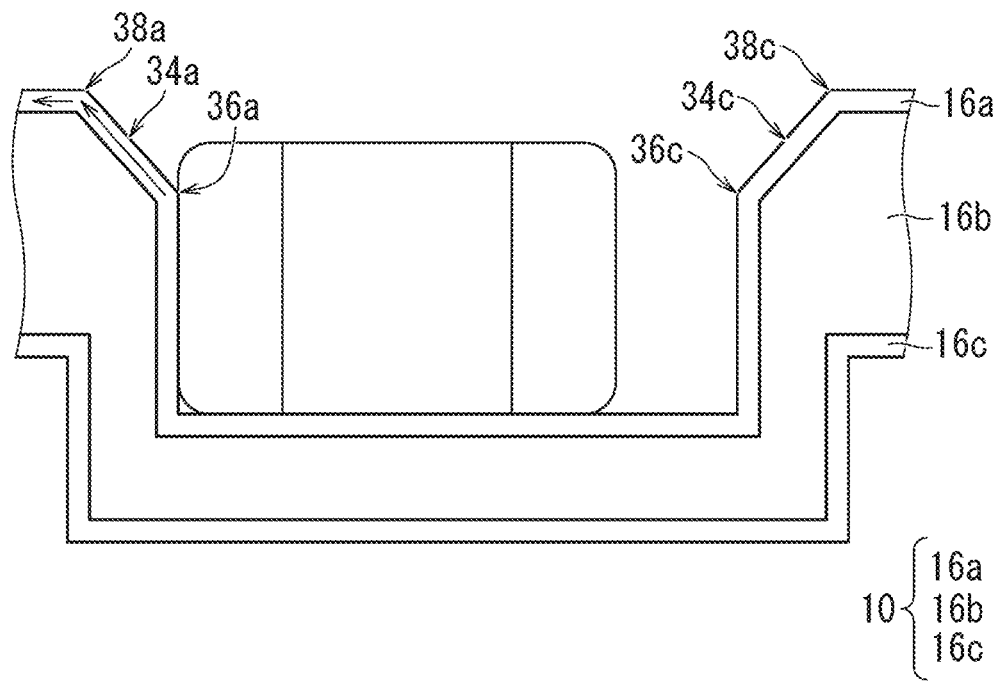
FIG. 7A is a cross section for illustrating a conductive path of the base tape according to a preferred embodiment of the present invention.
Figure 7B:
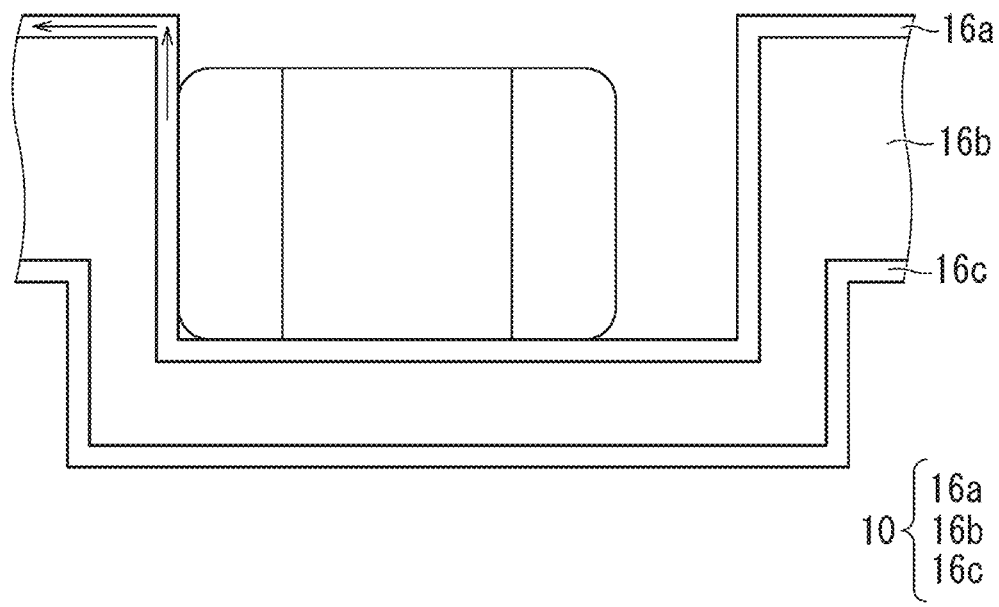
FIG. 7B is a cross section for illustrating a conductive path of a conventional base tape.

Accommodating section 20 will now be described in more detail with reference to FIGS. 4 to 7B. FIG. 4 shows a portion a shown in FIG. 1 with a multilayer ceramic capacitor accommodated therein. FIG. 5A is a cross section taken along a line VA-VA indicated in FIG. 4. FIG. 5B is an enlarged view of a portion b shown in FIG. 5A. FIG. 6 is a cross section taken along a line VI-VI indicated in FIG. 4. FIG. 7A is a cross section for illustrating a conductive path of the base tape according to a preferred embodiment of the present invention. FIG. 7B is a cross section for illustrating a conductive path of a conventional base tape.

As shown in FIGS. 4 to 6, accommodating section 20 includes a bottom surface portion 30, a side wall portion 31 including a plurality of surfaces, and an opening portion 38. Side wall portion 31 includes, at at least one surface thereof, an edge portion 36 located between bottom surface portion 30 and opening portion 38, and an electrical discharge path portion 34 inclined from edge portion 36 toward opening portion 38. Side wall portion 31 includes, at at least one surface thereof, a planar portion 32 which is a surface extending from bottom surface portion 30 to edge portion 36, and electrical discharge path portion 34 inclined from edge portion 36 toward opening portion 38.

Bottom surface portion 30 is rectangular or substantially rectangular in a plan view. Bottom surface portion is a portion on which multilayer ceramic capacitor 14 is disposed. Side wall portion 31 connects to bottom surface portion 30 and extends toward opening portion 38 to define a side wall of accommodating section 20. Opening portion 38 is rectangular or substantially rectangular in a plan view. Accommodating section 20 includes opening portion 38 with shorter sides 38a and 38c and longer sides 38b and 38d. Side wall portion 31 connected to side 38a of opening portion 38 is defined as a first side wall portion 31a, side wall portion 31 connected to side 38b of opening portion 38 is defined as a second side wall portion 31b, side wall portion 31 connected to side 38c of opening portion 38 is defined as a third side wall portion 31c, and side wall portion 31 connected to side 38d of opening portion 38 is defined as a fourth side wall portion 31d. Side wall portion 31 includes first side wall portion 31a, second side wall portion 31b, third side wall portion 31c, and fourth side wall portion 31d.

In a preferred embodiment of the present invention, side wall portion 31 includes four surfaces provided with electrical discharge path portion 34. Planar portion 32, electrical discharge path portion 34, and edge portion 36 provided at first side wall portion 31a are referred to as a first planar portion 32a, a first electrical discharge path portion 34a, and a first edge portion 36a. Planar portion 32, electrical discharge path portion 34, and edge portion 36 provided at second side wall portion 31b are referred to as a second planar portion 32b, a second electrical discharge path portion 34b, and a second edge portion 36b. Planar portion 32, electrical discharge path portion 34, and edge portion 36 provided at third side wall portion 31c are referred to as a third planar portion 32c, a third electrical discharge path portion 34c, and a third edge portion 36c. Planar portion 32, electrical discharge path portion 34, and edge portion 36 provided at fourth side wall portion 31d are referred to as a fourth planar portion 32d, a fourth electrical discharge path portion 34d, and a fourth edge portion 36d. Therefore, planar portion 32 includes first planar portion 32a, second planar portion 32b, third planar portion 32c, and fourth planar portion 32d. Electrical discharge path portion 34 includes first electrical discharge path portion 34a, second electrical discharge path portion 34b, third electrical discharge path portion 34c, and fourth electrical discharge path portion 34d. Edge portion 36 includes first edge portion 36a, second edge portion 36b, third edge portion 36c, and fourth edge portion 36d.

Electrical discharge path portion 34 defines a path for discharging static electricity that is charged in multilayer ceramic capacitor 14 through the carbon layer of first layer 16a when planar portion 32 or edge portion 36 is in contact with external electrode 14b of multilayer ceramic capacitor 14.

A conductive path in a case where electrical discharge path portion 34 is provided to accommodating section 20 of base tape 10 and that in a case where electrical discharge path portion 34 is not provided to accommodating section 20 of base tape 10 will be described with reference to FIGS. 7A and 7B. As shown in FIGS. 7A and 7B, the case where electrical discharge path portion 34 is provided to accommodating section 20 of base tape 10 (FIG. 7A) has a shorter conductive path than the case where electrical discharge path portion 34 is not provided to accommodating section 20 of base tape 10 (FIG. 7B). Thus, providing electrical discharge path portion 34 enables base tape 10 to have an improved antistatic ability.

Further, when molding accommodating section 20, extension in a direction perpendicular or substantially perpendicular to the carbon layer of first layer 16a would tear the carbon layer of first layer 16a. However, electrical discharge path portion 34 that is inclined alleviates stress applied thereto. Accordingly, a range in which extension occurs in the direction perpendicular or substantially perpendicular to first layer 16a is reduced, and tearing of the carbon layer of first layer 16a in electrical discharge path portion 34 and edge portion 36 is reduced or prevented.

Further, planar portion 32 and electrical discharge path portion 34 preferably form an angle θ of about 95 degrees or more and about 175 degrees or less, for example. By providing electrical discharge path portion 34 in this manner, an opening area is increased from edge portion 36 toward opening portion 38 and multilayer ceramic capacitor 14 can be easily inserted and extracted.

Electrical discharge path portion 34 provided at any one of the four surfaces of side wall portion 31 of accommodating section 20 is sufficient, and electrical discharge path portion 34 may be provided at all of the four surfaces of side wall portion 31 of accommodating section 20. For example, electrical discharge path portion 34 is preferably provided at side wall portions 31a and 31c on the sides of shorter sides 38a and 38c of opening portion 38 of accommodating section 20. When electrical discharge path portion 34 is provided at side wall portions 31a and 31c on the sides of shorter sides 38a and 38c of opening portion 38 of accommodating section 20, breakage of the carbon layer of first layer 16a can be reduced or prevented more than when electrical discharge path portion 34 is provided at side wall portions 31b and 31d on the sides of longer sides 38b and 38d of opening portion 38 of accommodating section 20.

A length of accommodating section 20 from bottom surface portion 30 to opening portion 38 is indicated as C1, and a length of accommodating section 20 from bottom surface portion 30 to edge portion 36 is indicated as C2. Length C2 of accommodating section 20 from bottom surface portion 30 to edge portion 36 is shorter than length C1 of accommodating section 20 from bottom surface portion 30 to opening portion 38. Length C2 from bottom surface portion 30 to edge portion 36 is preferably, for example, about 0.5 time or more and about 0.8 time or less a length T of multilayer ceramic capacitor 14 in the heightwise direction. Thus, providing the length from bottom surface portion 30 to edge portion 36 ensures that multilayer ceramic capacitor 14 can be brought into contact with the carbon layer of first layer 16a of base tape 10.

Further, a length of accommodating section 20 in a longitudinal direction, which is the same direction as widthwise direction z of base tape 10, is represented as A. Length A of accommodating section 20 in the longitudinal direction is preferably, for example, about 1.02 times or more and about 1.30 times or less the length L of multilayer ceramic capacitor 14 in the lengthwise direction thereof. Thus, providing length A of accommodating section 20 in the longitudinal direction thereof ensures that multilayer ceramic capacitor 14 can be brought into contact with the carbon layer of first layer 16a of base tape 10.

Further, as shown in FIG. 6, for example, a length of accommodating section 20 in a shorter-side direction, which is the same direction as longitudinal direction y of base tape 10, is represented as B. Length B of accommodating section 20 in the shorter-side direction is preferably, for example, about 1.02 times or more and about 1.30 times or less the length W of multilayer ceramic capacitor 14 in the widthwise direction thereof. Thus, providing length B of accommodating section 20 in the shorter-side direction thereof ensures that multilayer ceramic capacitor 14 can be brought into contact with the carbon layer of first layer 16a of base tape 10.

Furthermore, base tape 10 according to a preferred embodiment of the present invention preferably includes accommodating section 20 such that an average thickness D1 of first layer 16a of electrical discharge path portion 34 is larger than an average thickness D2 of first layer 16a of side wall portion 31. This ensures that first layer 16a of electrical discharge path portion 34 is conductive.

Further, base tape 10 according to a preferred embodiment of the present invention is preferably configured such that a total peeled area E1 of first layer 16a of electrical discharge path portion 34 is smaller than a total peeled area E2 of first layer 16a of side wall portion 31. Herein, a total peeled area is an area where the carbon layer defined as first layer 16a is exposed at the surface of interest of side wall portion 31. First layer 16a of electrical discharge path portion 34 thus has the carbon layer torn in a smaller range than first layer 16a of side wall portion 31 does, and this ensures that first layer 16a is conductive.

Further, when base tape 10 according to a preferred embodiment of the present invention, for example, has a three-layer structure, and a layer with which multilayer ceramic capacitor 14 comes into contact is first layer 16a, a layer provided on the side of a back surface of first layer 16a is a second layer 16b, and a layer provided on the side of a back surface of second layer 16b is a third layer 16c, then, first layer 16a and third layer 16c are preferably made of polystyrene and carbon and second layer 16b is preferably made of polystyrene, for example. As first layer 16a with which multilayer ceramic capacitor 14 comes into contact includes a carbon layer, conductivity is improved and an antistatic ability is provided. In addition, as first layer 16a and third layer 16c include a carbon layer, base tape 10 can be manufactured without concern about the front and back sides thereof.

Further, electrical discharge path portion 34 provided to accommodating section 20 of base tape 10 according to a preferred embodiment of the present invention is preferably provided at side wall portions 31a and 31c on the sides of the shorter sides of opening portion 38 of accommodating section 20. When accommodating section 20 of base tape 10 is formed, the carbon layer of first layer 16a is pulled, and the carbon layer may be reduced in thickness or cut. By providing electrical discharge path portion 34 at side wall portions 31a and 31c on the sides of the shorter sides of opening portion 38 of accommodating section 20, concentration of stress in the vertical direction is reduced or prevented, and the carbon layer of first layer 16a of planar portion 32 and edge portion 36 can remain in a wider range. This increases the possibility that the pair of external electrodes 14b of multilayer ceramic capacitor 14 comes into contact with the carbon layer of first layer 16a, and an antistatic ability is thus provided.

When base tape 10 according to a preferred embodiment of the present invention is made of resin, base tape 10 is formed by, for example, vacuum forming, compressed-air molding, press forming, or the like.

Figure 8:
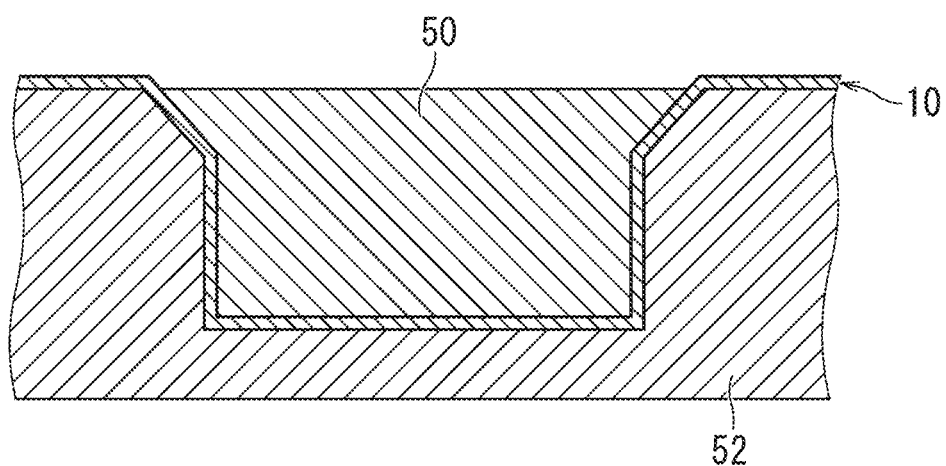
FIG. 8 is a cross section showing an example of an apparatus for manufacturing a base tape according to a preferred embodiment of the present invention.
Figure 9A:
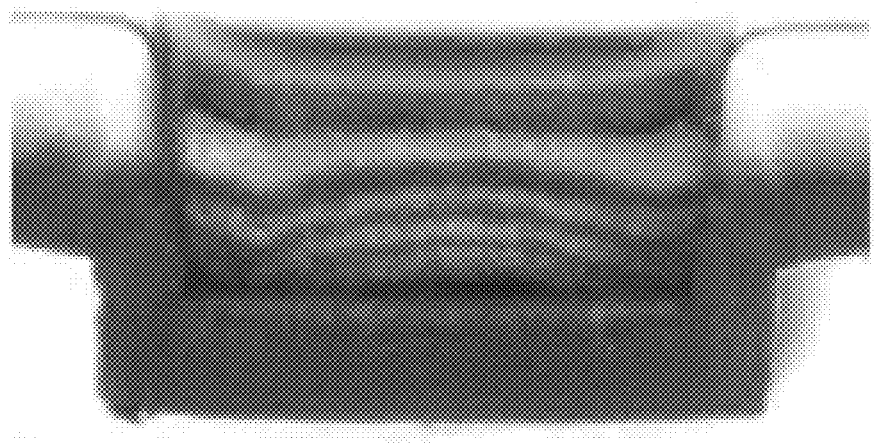
FIG. 9A is a cross section at a location of about ½ of the length of a shorter side of an accommodating section of a conventional base tape.
Figure 9B:
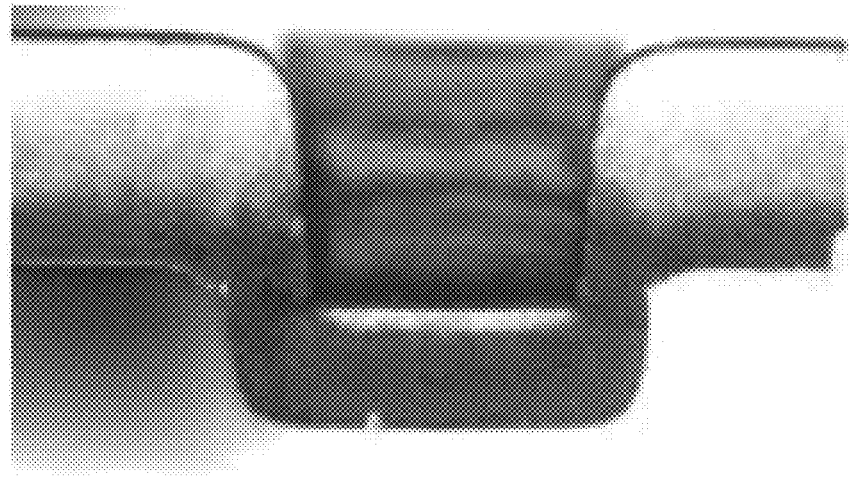
FIG. 9B is a cross section at a location of about ½ of the length of a longer side of the accommodating section of the conventional base tape.

In the present preferred embodiment, base tape 10 is preferably made of resin, for example, and a non-limiting example of a method for forming base tape 10 by press forming will be described with reference to FIG. 8. FIG. 8 is a cross section showing an example of an apparatus for manufacturing a base tape according to a preferred embodiment of the present invention.

Initially, a polystyrene sheet (second layer 16b) is prepared.

Subsequently, a solvent in which polystyrene and carbon are mixed together is applied to the opposite surfaces of the polystyrene sheet (second layer 16b) to provide first layer 16a and third layer 16c.

Subsequently, the polystyrene sheet with polystyrene and carbon applied thereto is placed between an upper mold half 50 and a lower mold half 52 and press-formed.

Finally, upper mold half 50 and lower mold half 52 are removed. By repeating the above operation a plurality of times, base tape 10 including accommodating sections 20 aligned in a line is formed.

2. Electronic Component Array

Figure 2:
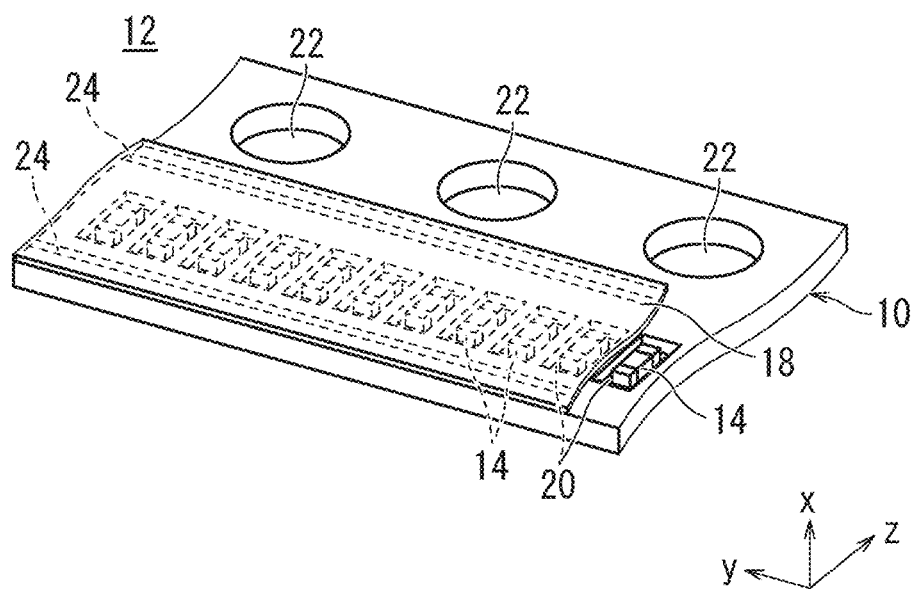
FIG. 2 is a perspective view of an electronic component array according to a preferred embodiment of the present invention.

Electronic component array 12 according to a preferred embodiment of the present invention will be described with reference to FIG. 2. FIG. 2 is a perspective view showing an electronic component array according to a preferred embodiment of the present invention.

Electronic component array 12 according to the present preferred embodiment of the present invention includes multilayer ceramic capacitor 14 as described above, base tape 10, as described above, accommodating multilayer ceramic capacitor 14, and a cover tape 18 covering accommodating section 20 of base tape 10.

Cover tape 18 is attached to a surface of one side of base tape 10 so as to cover accommodating section 20 of base tape 10. Cover tape 18 is also disposed such that it does not close feeding hole 22 of base tape 10.

Cover tape 18 is preferably made of, for example, polyethylene terephthalate. Cover tape 18 made of a material having a small electric resistance value can be prevented from being electrically charged.

Electronic component array 12 according to the present preferred embodiment of the present invention may be manufactured, for example, as follows: accommodating section 20 of base tape 10 with multilayer ceramic capacitor 14 received therein is covered with cover tape 18, and base tape 10 and cover tape 18 are welded together at a welding portion 24 on sides of cover tape 18 which are opposite in longitudinal direction y with accommodating section 20 therebetween.

When electronic component array 12 according to the present preferred embodiment includes multilayer ceramic capacitor 14 which is an ultraminiature multilayer ceramic capacitor, in particular, reducing or preventing positional displacement of multilayer ceramic capacitor 14 due to static electricity can reduce or prevent unsatisfactory mounting. When multilayer ceramic capacitor 14 is electrically charged, static electricity is generated between multilayer ceramic capacitor 14 and a nozzle of the automatic component feeder, and positional displacement may be caused during sucking by the automatic component feeder. In the case of an ultraminiature electronic component, in particular, a slight positional displacement may result in unsatisfactory mounting. Electronic component array 12 according to the present preferred embodiment has an antistatic ability, and can thus reduce or prevent unsatisfactory mounting.

Furthermore, electronic component array 12 according to the present preferred embodiment is preferably configured such that a direction orthogonal or substantially orthogonal to shorter sides 38a and 38c of opening portion 38 of accommodating section of base tape 10 is the same or substantially the same as longitudinal direction z of multilayer ceramic capacitor 14 accommodated. This enables electronic component array 12 to be manufactured with multilayer ceramic capacitors 14 aligned, and thus easily used in the automatic component feeder. Further, multilayer ceramic capacitor 14 preferably includes external electrode 14b on opposite end surfaces 14a1 and 14a2 of multilayer body 14a in longitudinal direction z. When electrical discharge path portion 34 is provided on the sides of the shorter sides of opening portion 38 of base tape 10, external electrode 14b and side wall portion 31 or edge portion 36 easily contact each other, and antistatic ability can be more effectively.

Further, length C2 of accommodating section 20 from bottom surface portion 30 to edge portion 36 is preferably shorter than height T of multilayer ceramic capacitor 14 accommodated in accommodating section 20. This facilitates external electrode 14b of multilayer ceramic capacitor 14 to come into contact with edge portion 36 of accommodating section 20 to enable the antistatic ability to be more effectively provided.

3. Exemplary Experiment

Base tape 10 was produced in the method for producing a base tape as described above, and a proportion of occurrence of failure was measured in inserting multilayer ceramic capacitor 14 to base tape 10 and in removing multilayer ceramic capacitor 14 from base tape 10. A failure occurring when inserting multilayer ceramic capacitor 14 to base tape 10 for example occurs when multilayer ceramic capacitor 14 is displaced from accommodating section 20 due to static electricity when multilayer ceramic capacitor 14 is inserted to base tape 10. A failure occurring when multilayer ceramic capacitor 14 is removed from base tape 10 for example occurs when multilayer ceramic capacitor 14 is attracted to cover tape 18 by static electricity.

Various parameters of electronic component array 12 used in this experiment were as follows:

Size of multilayer ceramic capacitor: L×W×T=about 0.25 mm×about 0.125 mm×about 0.125 mm Arrangement of electrical discharge path: electrical discharge path portion at the four surfaces of the side wall portion Angle θ between the planar portion and the electrical discharge path portion: about 100 degrees Length from bottom surface portion to edge: about 0.1 mm How many times the multilayer ceramic capacitor is inserted into the base tape: about 100,000 times How many times the multilayer ceramic capacitor is removed from the base tape: about 100,000 times Peel strength (on one side): about 0.1 N or more and about 0.25 N or less Electronic component array: 10 reels for each sample Table 1 shows measurement results. In Table 1, a case where a failure has occurred at a proportion of about 0.2% or less is assessed as "pass," and a case where a failure has occurred at a proportion larger than about 0.2% is assessed as "fail."

TABLE 1

| | clearance (width of accommodating section/dimension of component) | insertion | removal |
|---|---|---|---|
| comp. ex 1 | 1.01 | fail | pass |
| ex 1 | 1.02 | pass | pass |
| ex. 2 | 1.05 | pass | pass |
| ex. 3 | 1.10 | pass | pass |
| ex. 4 | 1.20 | pass | pass |
| ex. 5 | 1.30 | pass | pass |
| comp. ex. 2 | 1.35 | fail | pass |
| comp. ex. 3 | 1.40 | fail | fail |

A failure occurring when inserting multilayer ceramic capacitor 14 into base tape 10 and a failure occurring when removing multilayer ceramic capacitor 14 from base tape 10 can be reduced or prevented by setting a ratio of length A of accommodating section 20 on the side of the longer side thereof to length L of multilayer ceramic capacitor 14 in the lengthwise direction thereof (i.e., A/T) to be about 1.02 or more about 1.30 or less.

It should be noted that although preferred embodiments of the present invention are disclosed in the above description, the present invention is not limited thereto.

That is, various modifications in mechanism, shape, material, number and amount, position, arrangement, and the like can be made to the above-described preferred embodiment without departing from the technological idea of the present invention and the scope of the present invention, and are encompassed in the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A base tape comprising:
    an accommodating section having a rectangular or substantially rectangular parallelepiped shape; and
    a surface layer including a carbon layer; wherein
    the accommodating section includes a bottom surface portion, a side wall portion including a plurality of surfaces, and an opening portion; and
    the side wall portion includes, at at least one surface thereof, a planar portion which is a surface extending from the bottom surface portion to an edge portion located between the bottom surface portion and the opening portion, and an electrical discharge path portion inclined from the edge portion toward the opening portion.

2. The base tape according to claim 1, wherein
    the base tape has a layered structure including a plurality of layers; and
    a layer at which the base tape and an electronic component accommodated in the accommodating section contact each other is a first layer; and
    an average thickness of the first layer of the electrical discharge path portion is larger than an average thickness of the first layer of the side wall portion.

3. The base tape according to claim 1, wherein
    the base tape has a layered structure including a plurality of layers;
    a layer at which the base tape and an electronic component accommodated in the accommodating section contact each other is a first layer; and
    a total peeled area of the first layer of the electrical discharge path portion is smaller than a total peeled area of the first layer of the side wall portion.

4. The base tape according to claim 1, wherein
    the base tape has a three-layer structure;
    a layer at which the base tape and an electronic component accommodated in the accommodating section contact each other is a first layer;
    a layer on a side of a back surface of the first layer is a second layer;
    a layer on a side of a back surface of the second layer is a third layer; and
    the first layer and the third layer are made of polystyrene and carbon and the second layer is made of polystyrene.

5. The base tape according to claim 1, wherein the electrical discharge path portion is provided at the side wall portion located on a side of a shorter side of the opening portion of the accommodating section.

6. An electronic component array comprising:
    the base tape according to claim 1;
    an electronic component accommodated in the accommodating section of the base tape; and
    a cover tape that covers the accommodating section.

7. The electronic component array according to claim 6, wherein a direction orthogonal or substantially orthogonal to a shorter side of the opening portion of the accommodating section is identical or substantially identical to a longitudinal direction of the electronic component accommodated in the accommodating section.

8. The electronic component array according to claim 6, further comprising an external electrode on opposite surfaces of the electronic component in a longitudinal direction of the electronic component.

9. The electronic component array according to claim 6, wherein a length of the accommodating section from the bottom surface portion to the edge portion is shorter than a height of the electronic component accommodated in the accommodating section.

10. The electronic component array according to claim 6, wherein
the base tape has a layered structure including a plurality of layers; and
a layer at which the base tape and an electronic component accommodated in the accommodating section contact each other is a first layer; and
an average thickness of the first layer of the electrical discharge path portion is larger than an average thickness of the first layer of the side wall portion.

11. The electronic component array according to claim 6, wherein
the base tape has a layered structure including a plurality of layers;
a layer at which the base tape and an electronic component accommodated in the accommodating section contact each other is a first layer; and
a total peeled area of the first layer of the electrical discharge path portion is smaller than a total peeled area of the first layer of the side wall portion.

12. The electronic component array according to claim 6, wherein
the base tape has a three-layer structure;
a layer at which the base tape and an electronic component accommodated in the accommodating section contact each other is a first layer;
a layer on a side of a back surface of the first layer is a second layer;
a layer on a side of a back surface of the second layer is a third layer; and
the first layer and the third layer are made of polystyrene and carbon and the second layer is made of polystyrene.

13. The electronic component array according to claim 6, wherein the electrical discharge path portion is provided at the side wall portion located on a side of a shorter side of the opening portion of the accommodating section.

14. The base tape according to claim 1, further comprising feeding holes aligned in a longitudinal direction of the base tape.

15. The base tape according to claim 2, wherein the layer is made of at least one of polystyrene, polyethylene terephthalate, polycarbonate, or polypropylene.

16. The base tape according to claim 1, wherein an angle between the electrical discharge path portion and the edge portion is about 95 degrees or more and about 175 degrees or less.

17. The electronic component array according to claim 6, wherein the base tape includes feeding holes aligned in a longitudinal direction of the base tape.

18. The electronic component array according to claim 10, wherein the layer is made of at least one of polystyrene, polyethylene terephthalate, polycarbonate, or polypropylene.

19. The electronic component array according to claim 6, wherein an angle between the electrical discharge path portion and the edge portion is about 95 degrees or more and about 175 degrees or less.

20. The electronic component array according to claim 6, wherein the electronic component is a multilayer ceramic capacitor.

* * * * *